(12) United States Patent
Liu

(10) Patent No.: US 12,408,518 B2
(45) Date of Patent: Sep. 2, 2025

(54) DISPLAY PANEL AND DISPLAY DEVICE AND METHOD OF MANUFACTURING DISPLAY PANEL

(71) Applicant: Shenzhen China Star Optoelectronics Semiconductor Display Technology Co., Ltd., Shenzhen (CN)

(72) Inventor: Fangmei Liu, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 17/622,270

(22) PCT Filed: Dec. 17, 2021

(86) PCT No.: PCT/CN2021/139221
§ 371 (c)(1),
(2) Date: Dec. 23, 2021

(87) PCT Pub. No.: WO2023/103044
PCT Pub. Date: Jun. 15, 2023

(65) Prior Publication Data
US 2024/0032348 A1    Jan. 25, 2024

(30) Foreign Application Priority Data

Dec. 9, 2021 (CN) .......................... 202111501116.X

(51) Int. Cl.
*H10K 59/124* (2023.01)
*H10K 59/12* (2023.01)
*H10K 59/131* (2023.01)

(52) U.S. Cl.
CPC ....... *H10K 59/124* (2023.02); *H10K 59/1201* (2023.02); *H10K 59/131* (2023.02)

(58) Field of Classification Search
None
See application file for complete search history.

(56) References Cited

U.S. PATENT DOCUMENTS

2010/0155733 A1    6/2010   Moon et al.
2024/0032348 A1*   1/2024   Liu .................. H10K 59/124

FOREIGN PATENT DOCUMENTS

CN    103258743 A    8/2013
CN    109427817 A    3/2019
(Continued)

OTHER PUBLICATIONS

International Search Report in International application No. PCT/CN2021/139221, mailed on Aug. 29, 2022.
(Continued)

*Primary Examiner* — Jack S Chen
(74) *Attorney, Agent, or Firm* — PV IP PC; Wei Te Chung

(57) ABSTRACT

A display panel, a display device, and a method of manufacturing a display panel are provided. The display panel includes the plurality of stacked metal sub-layers and the first passivation sub-layer and the second passivation sub-layer stacked. The first passivation sub-layer is disposed between the metal layer and the second passivation layer. Material of the first passivation sub-layer includes silicon nitride. The first passivation sub-layer covers the untidy area at the ends of the molybdenum-titanium alloy thin layer to avoid from detachment of the passivation layer, and meanwhile to solve the issues of simplifying the manufacturing process of the display panel, and to avoid from oxidation of the bonding pads.

16 Claims, 6 Drawing Sheets

(56) References Cited

FOREIGN PATENT DOCUMENTS

| CN | 110676222 A | 1/2020 |
| CN | 111129104 A | 5/2020 |
| CN | 111682044 A | 9/2020 |
| CN | 112002823 A | 11/2020 |
| JP | 2020520538 A | 7/2020 |
| JP | 2020532877 A | 11/2020 |
| JP | 2021502579 A | 1/2021 |
| WO | 2019080223 A1 | 5/2019 |

OTHER PUBLICATIONS

Written Opinion of the International Search Authority in International application No. PCT/CN2021/139221, mailed on Aug. 29, 2022.
Chinese Office Action issued in corresponding Chinese Patent Application No. 202111501116.X dated Nov. 11, 2022, pp. 1-7.
Chinese Office Action issued in corresponding Chinese Patent Application No. 202111501116.X dated Mar. 26, 2023, pp. 1-7.
Chinese Decision of Rejection issued in corresponding Chinese Patent Application No. 202111501116.X dated Jun. 29, 2023, pp. 1-7.
Japanese Office Action issued in corresponding Japanese Patent Application No. 特願2021-576403 dated Jan. 30, 2024, pp. 1-4.

* cited by examiner

DISPLAY PANEL AND DISPLAY DEVICE AND METHOD OF MANUFACTURING DISPLAY PANEL

CROSS-REFERENCE TO RELATED APPLICATION

This application is a national phase application under 35 U.S.C. § 371 of PCT Application No. PCT/CN2021/139221 filed Dec. 17, 2021, which claims priority to Chinese Application No. 202111501116.X filed Dec. 9, 2021, the contents of which are incorporated herein by reference in their entirety.

FIELD

The present disclosure relates to display technologies, and more particularly, to a display panel, a display device, and a method of manufacturing a display panel.

BACKGROUND

In order to reduce the impedance, copper is used for the metal in the peripheral pad area of large-size display panels. But copper is easily oxidized or corroded in the air. In order to solve this problem, a layer of protective metal is generally used to cover the copper pads. But this kind of scheme needs to increase photomask in process. Another solution is to deposit multiple layers of metal in a process of depositing the metal layer of the entire display panel, and deposit molybdenum-titanium alloy (MoTi) on the copper metal. This solution does not need to add a photomask.

However, in the scheme of depositing a molybdenum-titanium alloy on the copper metal for the internal circuit of the display panel, in order to reduce the impedance, a thickness of a molybdenum-titanium alloy must be reduce. When etching a thinner molybdenum-titanium alloy, there is untidy (tip) at ends of the molybdenum-titanium alloy thin layer. The unevenness will cause detachment between the molybdenum-titanium alloy thin layer and the subsequent silicon oxide passivation layer.

Therefore, there is an urgent need to simultaneously solve the issues of simplifying the manufacturing process of the display panel, avoiding from oxidation of the pads, and avoiding from detachment of the passivation layer.

SUMMARY

In view of the above, the present disclosure provides a display panel, a display device, and a method of manufacturing a display panel to solve the technical issues of simplifying the manufacturing process of the display panel, avoiding from oxidation of the pads, and avoiding from detachment of the passivation layer.

In order to achieve above-mentioned object of the present disclosure, one embodiment of the disclosure provides a display panel, including a display region and a bezel region, wherein the display panel further includes:
a substrate;
a metal layer disposed on the substrate and including a plurality of stacked metal sub-layers; and
a passivation layer disposed on the metal layer and including stacked first passivation sub-layer and second passivation sub-layer, wherein the first passivation sub-layer is disposed between the metal layer and the second passivation sub-layer, the metal layer further includes source/drain patterns in the display region and bonding pad patterns in the bezel region, and material of the first passivation sub-layer includes silicon nitride.

In one embodiment of the display panel, the first passivation sub-layer covers the metal layer, the second passivation sub-layer covers the first passivation sub-layer, and material of the second passivation sub-layer includes silicon oxide.

In one embodiment of the display panel, a thickness of the first passivation sub-layer ranges from 100 nm to 300 nm, and a thickness of the second passivation sub-layer ranges from 100 nm to 300 nm.

In one embodiment of the display panel, the plurality of metal sub-layers includes a first metal sub-layer, a second metal sub-layer, and a third metal sub-layer, and wherein the second metal sub-layer covers the first metal sub-layer, the third metal sub-layer covers the second metal sub-layer, and material of the third metal sub-layer includes molybdenum titanium alloy.

In one embodiment of the display panel, material of the first metal sub-layer includes molybdenum titanium alloy, and material of the second metal sub-layer includes copper.

In one embodiment of the display panel, a thickness of the first metal sub-layer is greater than zero and less than 100 nm, a thickness of the second metal sub-layer ranges from 400 nm to 800 nm, and a thickness of the third metal sub-layer is greater than zero and less than 100 nm.

In one embodiment of the display panel, the display panel further includes:
a planarization layer disposed on the passivation layer; and
a light emitting component disposed on the planarization layer.

Another embodiment of the disclosure further provides a display device, including a display panel and driving component connected to the display panel through a flexible circuit board, wherein the display panel includes a display region and a bezel region and further includes:
a substrate;
a metal layer disposed on the substrate and including a plurality of stacked metal sub-layers; and
a passivation layer disposed on the metal layer and including stacked first passivation sub-layer and second passivation sub-layer, wherein the first passivation sub-layer is disposed between the metal layer and the second passivation sub-layer, the metal layer further includes source/drain patterns in the display region and bonding pad patterns in the bezel region, material of the first passivation sub-layer includes silicon nitride, and the flexible circuit board is connected to the bonding pad patterns of the display panel.

In one embodiment of the display device, the first passivation sub-layer covers the metal layer, the second passivation sub-layer covers the first passivation sub-layer, and material of the second passivation sub-layer includes silicon oxide.

In one embodiment of the display device, a thickness of the first passivation sub-layer ranges from 100 nm to 300 nm, and a thickness of the second passivation sub-layer ranges from 100 nm to 300 nm.

In one embodiment of the display device, the plurality of metal sub-layers includes a first metal sub-layer, a second metal sub-layer, and a third metal sub-layer, and wherein the second metal sub-layer covers the first metal sub-layer, the third metal sub-layer covers the second metal sub-layer, and material of the third metal sub-layer includes molybdenum titanium alloy.

In one embodiment of the display device, material of the first metal sub-layer includes molybdenum titanium alloy, and material of the second metal sub-layer includes copper.

In one embodiment of the display device, a thickness of the first metal sub-layer is greater than zero and less than 100 nm, a thickness of the second metal sub-layer ranges from 400 nm to 800 nm, and a thickness of the third metal sub-layer is greater than zero and less than 100 nm.

In one embodiment of the display device, the display panel further includes:
  a planarization layer disposed on the passivation layer; and
  a light emitting component disposed on the planarization layer.

Another embodiment of the disclosure further provides a method of manufacturing a display panel, including steps of:
  providing a substrate;
  depositing a metal layer on the substrate, wherein the metal includes a plurality of stacked metal sub-layers;
  patterning the metal layer to form source/drain patterns and bonding pad patterns;
  depositing a first passivation sub-layer on the source/drain patterns and the bonding pad patterns; and
  depositing a second passivation sub-layer on the first passivation sub-layer, wherein material of the first passivation sub-layer includes silicon nitride.

In one embodiment of the method of manufacturing the display panel, the plurality of metal sub-layers includes a first metal sub-layer, a second metal sub-layer, and a third metal sub-layer, and wherein the second metal sub-layer covers the first metal sub-layer, the third metal sub-layer covers the second metal sub-layer, and material of the third metal sub-layer includes molybdenum titanium alloy In comparison with prior art, the disclosure provides the display panel, the display device, and the method of manufacturing the display panel include the plurality of stacked metal sub-layers and the first passivation sub-layer and the second passivation sub-layer stacked. The first passivation sub-layer is disposed between the metal layer and the second passivation layer. Material of the first passivation sub-layer includes silicon nitride. The first passivation sub-layer covers the untidy (tip) area at the ends of the molybdenum-titanium alloy thin layer to avoid from detachment of the passivation layer, and meanwhile to solve the issues of simplifying the manufacturing process of the display panel, and to avoid from oxidation of the bonding pads.

DETAILED DESCRIPTION

Figure 1:
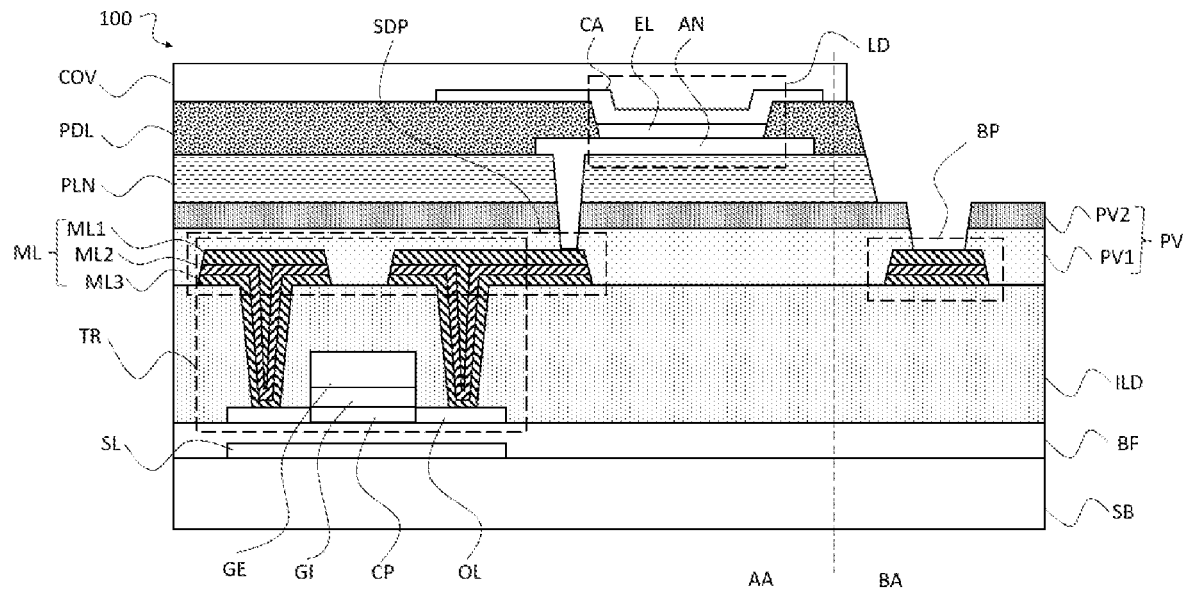
FIG. 1 is a schematic view of a structure of a display panel of an embodiment of the present disclosure.

The specific structure and functional details disclosed herein are only representative and are used for the purpose of describing exemplary embodiments of the present application. However, this application can be implemented in many alternative forms, and should not be interpreted as being limited only to the embodiments set forth herein.

In the description of this application, it should be understood that the terms "center", "lateral", "upper", "lower", "left", "right", "vertical", "horizontal", "top", The orientation or positional relationship indicated by "bottom", "inner", "outer", etc. is based on the orientation or positional relationship shown in the drawings, and is only for the convenience of describing the application and simplifying the description, and does not indicate or imply the pointed device Or the element must have a specific orientation, be constructed and operated in a specific orientation, and therefore cannot be understood as a limitation of the present application. In addition, the terms "first" and "second" are only used for descriptive purposes and cannot be understood as indicating or implying relative importance or implicitly indicating the number of indicated technical features. Therefore, the features defined with "first" and "second" may explicitly or implicitly include one or more of these features. In the description of this application, unless otherwise specified, "plurality" means two or more. In addition, the term "including" and any variations thereof is intended to cover non-exclusive inclusion.

In the description of this application, it should be noted that the terms "installation", "connection", and "connection" should be understood in a broad sense unless otherwise clearly specified and limited. For example, it can be a support connection or a detachable connection. Connected or integrally connected; it can be a mechanical connection or an electrical connection; it can be directly connected or indirectly connected through an intermediate medium, and it can be the internal communication between two components. For those of ordinary skill in the art, the specific meanings of the above-mentioned terms in this application can be understood under specific circumstances.

The terminology used here is only for describing specific embodiments and is not intended to limit the exemplary embodiments. Unless the context clearly dictates otherwise, the singular forms "a" and "one" used herein are also intended to include the plural. It should also be understood that the terms "including" and/or "comprising" used herein specify the existence of the stated features, integers, steps, operations, units and/or components, and do not exclude the existence or addition of one or more other features, integers, steps, operations, units, components, and/or combinations thereof.

The application will be further described below in conjunction with the drawings and embodiments.

Referring to FIG. 1, FIG. 1 is a schematic view of a structure of a display panel of an embodiment of the present disclosure. One embodiment of the disclosure provides a display panel 100, including a display region AA and a bezel region BA, wherein the display panel 100 further includes:
a substrate SB;
a metal layer ML disposed on the substrate SB and including a plurality of stacked metal sub-layers; and
a passivation layer PV disposed on the metal layer ML and including stacked first passivation sub-layer PV1 and second passivation sub-layer PV2, wherein the first passivation sub-layer PV1 is disposed between the metal layer ML and the second passivation sub-layer PV2, the metal layer ML further includes source/drain patterns SDP in the display region AA and bonding pad patterns BP in the bezel region BA, and material of the first passivation sub-layer PV1 includes silicon nitride.

In detail, material of the substrate SB includes glass, printed circuit board (PCB) or bismaleimide triazine (BT) resin board.

In detail, because material of the first sub-passivation layer PV1 includes silicon nitride with a better step coverage. Even if the end of the metal layer ML under the first passivation sub-layer PV1 has untidy (tip) area, it can still be covered well to avoid from gaps or cracks between the passivation layer and the metal layer ML. At the same time, because the present embodiment adopts the plurality of stacked metal sub-layers, a same mask can be used to form both the source/drain patterns SDP and the bonding pad patterns BP to simplify the manufacturing process of the display panel.

In detail, the general algorithm of step coverage is the surface area covered by the deposition divided by the total surface area to be covered.

In one embodiment of the display panel 100, the first passivation sub-layer PV1 covers the metal layer ML, the second passivation sub-layer PV2 covers the first passivation sub-layer PV1, and material of the second passivation sub-layer PV2 includes silicon oxide.

In one embodiment of the display panel 100, a thickness of the first passivation sub-layer PV1 ranges from 100 nm to 300 nm, and a thickness of the second passivation sub-layer PV2 ranges from 100 nm to 300 nm.

In one embodiment of the display panel 100, the plurality of metal sub-layers includes a first metal sub-layer ML1, a second metal sub-layer ML2, and a third metal sub-layer ML3, and wherein the second metal sub-layer ML2 covers the first metal sub-layer ML1, the third metal sub-layer ML3 covers the second metal sub-layer ML2, and material of the third metal sub-layer ML3 includes molybdenum titanium alloy (MoTi).

In detail, because material of the third metal sub-layer ML3 includes molybdenum-titanium alloy, it is easy to produce untidy area at the ends or edges of the third metal sub-layer ML3 during the process of forming the source/drain patterns SDP and the bonding pad patterns BP by etching. Material of the first sub-passivation layer PV1 includes silicon nitride with a better step coverage. Even if the end of the metal layer ML under the first passivation sub-layer PV1 has untidy area, it can still be covered well to avoid from gaps or cracks between the passivation layer and the metal layer ML. At the same time, because the present embodiment adopts the plurality of stacked metal sub-layers, a same mask can be used to form both the source/drain patterns SDP and the bonding pad patterns BP to simplify the manufacturing process of the display panel.

In one embodiment of the display panel 100, material of the first metal sub-layer ML1 includes molybdenum titanium alloy, and material of the second metal sub-layer ML2 includes copper.

In detail, copper has better conductivity. If a molybdenum-titanium alloy is used as a trace in a large display panel, it will cause extremely high trace impedance. Therefore, it is still necessary to use a metal with better conductivity, such as copper, as the material for the wiring. However, if copper is exposed to the air, it is easily oxidized, resulting in poor electrical properties. If a mask is used to etch the metal layer ML to form the source/drain patterns SDP and the bonding pad patterns BP, the bonding pad patterns BP will then be exposed to air and be oxidized while waiting to be bonded or soldered with the flexible circuit board. Therefore, this embodiment adopts multiple metal sub-layers, wherein the second metal sub-layer ML2 covers the first metal sub-layer ML1. The third metal sub-layer ML3 covers the second metal sub-layer ML2. The material of the second metal sub-layer ML2 includes copper and the material of the third metal sub-layer ML3 includes a molybdenum-titanium alloy. Using a molybdenum-titanium alloy that is less prone to oxidation as the third metal sub-layer ML covers the second metal sub-layer ML2 made of copper, which can avoid from the problem of bonding pad oxidation.

In one embodiment of the display panel 100, a thickness of the first metal sub-layer PV1 is greater than zero and less than 100 nm, a thickness of the second metal sub-layer PV2 ranges from 400 nm to 800 nm, and a thickness of the third metal sub-layer PV3 is greater than zero and less than 100 nm.

In one embodiment of the display panel 100, the display panel 100 further includes: a planarization layer PLN disposed on the passivation layer PV; and a light emitting component LD disposed on the planarization layer PLN.

In detail, the light emitting component LD is, for example, an organic light emitting diode (OLED), a micro light emitting diode (micro LED), or a submicron light emitting diode (mini light emitting diode, mini LED). The light-emitting component LD of the present application takes an organic light-emitting diode as an example, and includes a stacked anode AN, an organic light-emitting layer EL, and a cathode CA, but the present application is not limited thereto.

In the display panel 100 of some embodiments of the present application, the display panel 100 further includes a driving transistor TR disposed in the display region AA, wherein the source/drain patterns SDP form source SE and drain DE of the driving transistor TR.

In detail, the drawings of the present application taking an organic light-emitting diode as an example. The drain DE is connected to a conductive layer formed of indium tin oxide (ITO), and another end of the conductive layer forms the anode AN of the organic light-emitting diode.

In detail, the display panel 100 of some embodiment of the disclosure includes a substrate SB, a shading metal layer SL disposed on the substrate SB, a buffer layer BF covering the shading metal layer SL, a active layer disposed on the buffer layer BF, wherein the active layer includes semiconductor channel pattern CP and ohmic contact layer OL disposed on two opposite side of the channel pattern CP, a gate insulating layer GI covering the channel pattern CP, a gate GE disposed on the gate insulating layer GI, a interlayer insulating layer ILD covering the gate GE, the gate insulating layer GI, and the active layer, a source SE contacting the ohmic contact layer OL through the interlayer insulating layer ILD, bonding pad patterns BP and source/drain patterns SDP composed as a metal layer ML in a same process, wherein the metal layer ML includes a first metal sub-layer ML1, a second metal sub-layer ML2, and a third metal sub-layer ML3 stacked, a first passivation sub-layer PV1 covering the metal layer ML, a second passivation sub-layer PV2 covering the first passivation sub-layer PV1, a planarization layer PLN disposed on the second passivation sub-layer PV2, an anode AN passing through the planarization layer PLN, the second passivation sub-layer PV2, and the first passivation sub-layer PV1 to contact the drain DE, a pixel definition layer PDL disposed on the planarization layer PLN and the part of the anode AN, an organic light emitting layer EL disposed in a hole of the pixel definition layer PDL and above the anode AN, a cathode CA covering the organic light emitting layer EL, and a protecting layer COV covering the cathode CA and the pixel definition layer PDL.

Figure 2:
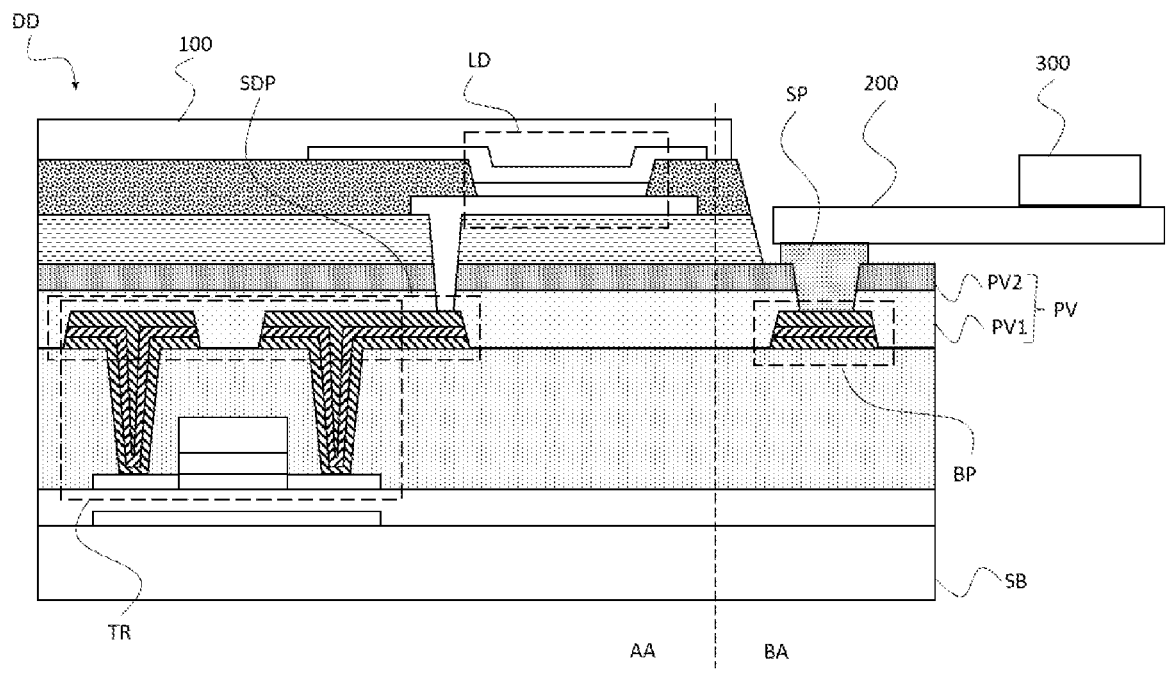
FIG. 2 is a schematic view of a structure of a display device of an embodiment of the present disclosure.

Referring to FIG. 2, FIG. 2 is a schematic view of a structure of a display device of an embodiment of the present disclosure. Another embodiment of the disclosure further provides a display device DD, including a display panel 100 and driving component 300 connected to the display panel 100 through a flexible circuit board 200.

In detail, the flexible circuit board 200 is connected to the bonding pad patterns BP by solder. The flexible circuit board 200 may also be connected to the bonding pad BP through anisotropic conductive film (ACF), and the application is not limited thereto.

Figure 3:
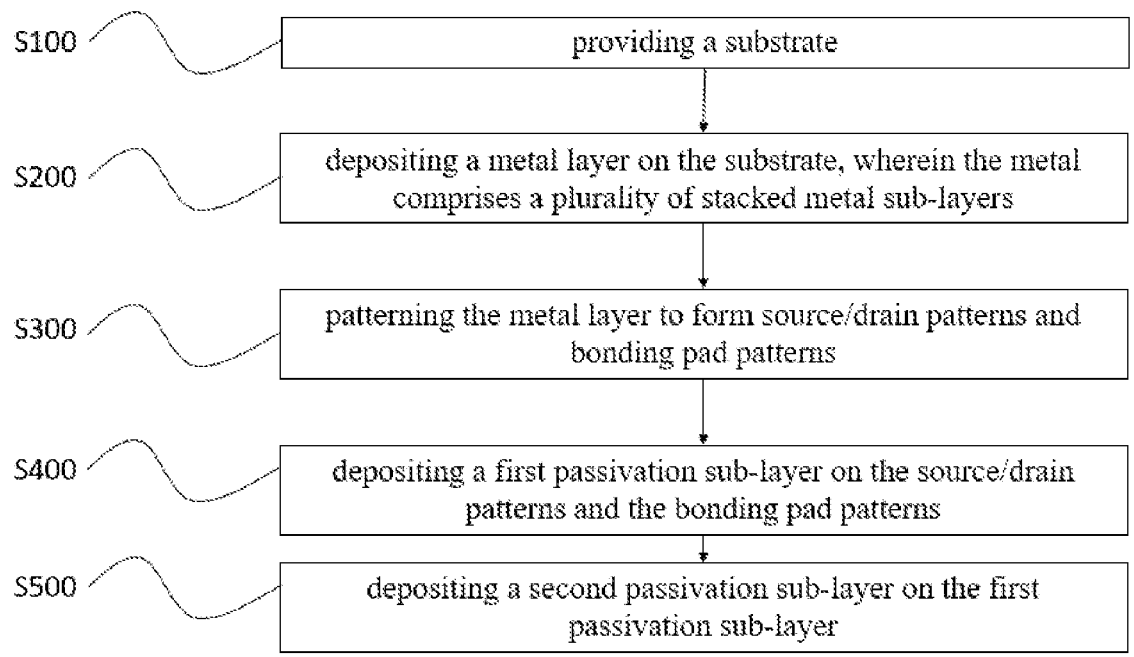
FIG. 3 is a schematic flowchart of a method of manufacturing a display panel of an embodiment of the present disclosure.

Referring to FIG. 3, FIG. 3 is a schematic flowchart of a method of manufacturing a display panel of an embodiment of the present disclosure. Another embodiment of the disclosure further provides a method of manufacturing a display panel, including steps of:

Step S100: providing a substrate;
Step S200: depositing a metal layer on the substrate, wherein the metal includes a plurality of stacked metal sub-layers;
Step S300: patterning the metal layer to form source/drain patterns and bonding pad patterns;
Step S400: depositing a first passivation sub-layer on the source/drain patterns and the bonding pad patterns; and
Step S500: depositing a second passivation sub-layer on the first passivation sub-layer.

Material of the first passivation sub-layer includes silicon nitride.

Figure 4:
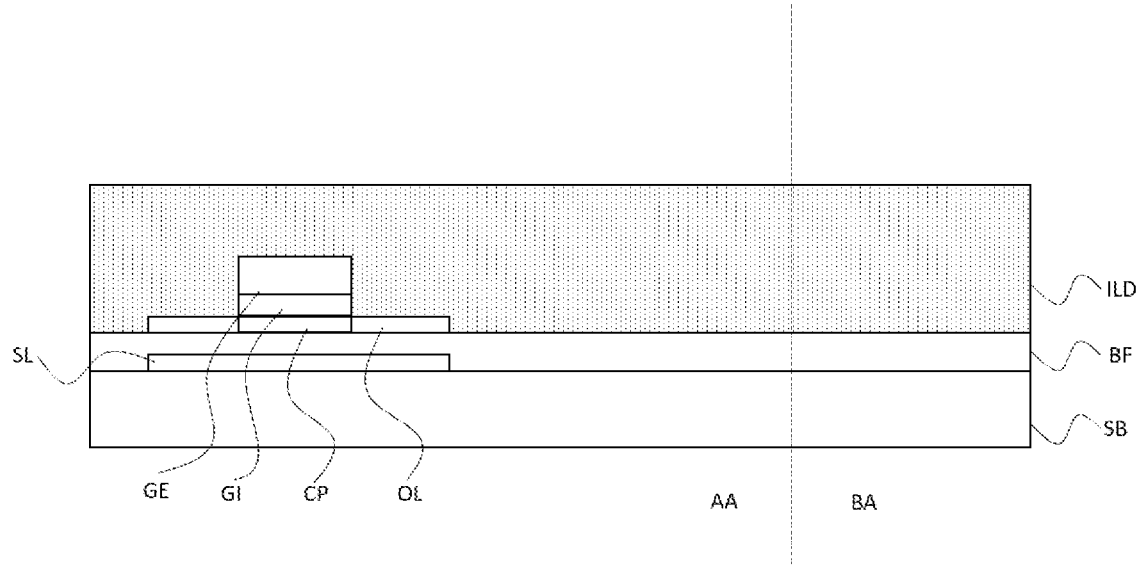
FIG. 4 is a schematic view of a structure of a substrate of an embodiment of the present disclosure.

In detail, referring to FIG. 4, FIG. 4 is a schematic view of a structure of a substrate of an embodiment of the present disclosure. The substrate SB in step S100 includes a shading metal layer SL disposed on the substrate SB, a buffer layer BF covering the shading metal layer SL, a active layer disposed on the buffer layer BF, wherein the active layer includes semiconductor channel pattern CP and ohmic contact layer OL disposed on two opposite side of the channel pattern CP, a gate insulating layer GI covering the channel pattern CP, a gate GE disposed on the gate insulating layer GI, a interlayer insulating layer ILD covering the gate GE, the gate insulating layer GI, and the active layer.

Figure 5A:
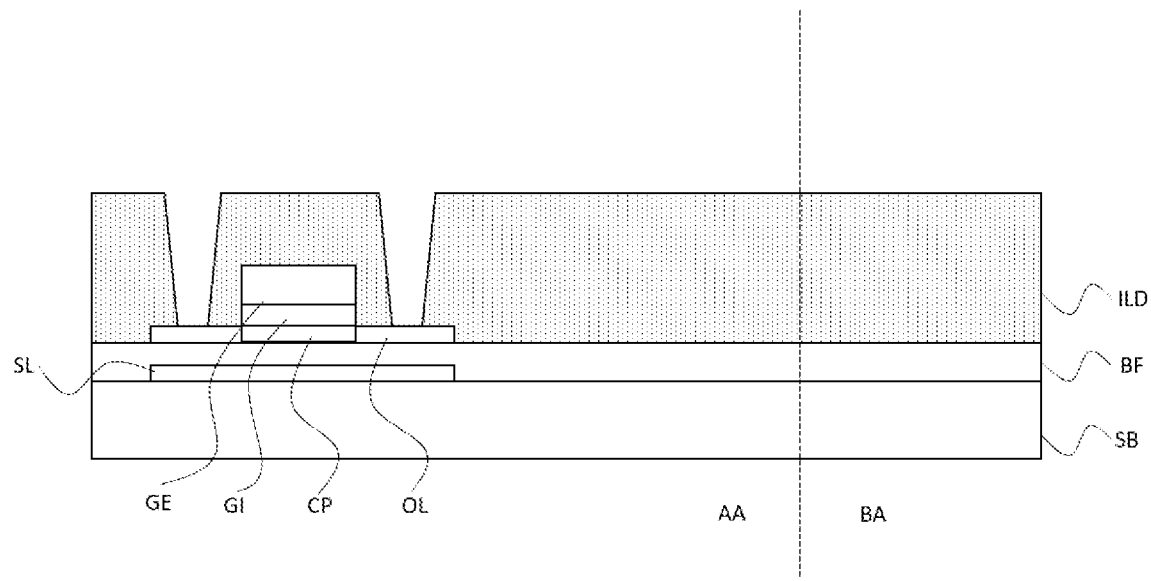
FIG. 5*a* is a schematic view of a structure of a display panel in certain step of production of an embodiment of the present disclosure.
Figure 5B:
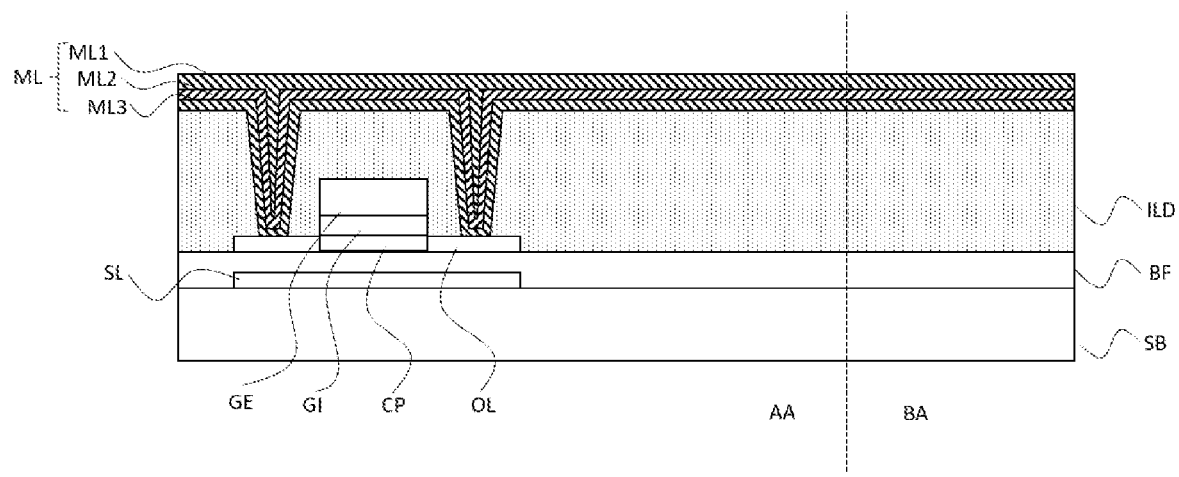
FIG. 5*b* is a schematic view of a structure of a display panel in another step of production of an embodiment of the present disclosure.

Specifically, please refer to FIG. 5a and FIG. 5b. FIG. 5a is a schematic view of a structure of a display panel in certain step of production of an embodiment of the present disclosure. FIG. 5b is a schematic view of a structure of a display panel in another step of production of an embodiment of the present disclosure. In the method of manufacturing the display panel of some embodiments of the present application, step S200: depositing a metal layer ML on the substrate, includes first etching the interlayer insulating layer ILD to form openings for the source electrode SE and the drain electrode DE, such as shown in FIG. 5a. Then the metal layer ML is deposited, as shown in FIG. 5b. In the method of manufacturing the display panel of some embodiments of the present application, the plurality of metal sub-layers includes a first metal sub-layer ML1, a second metal sub-layer ML2, and a third metal sub-layer ML3, wherein the second metal sub-layer ML2 covers the first metal sub-layer ML1, the third metal sub-layer ML3 covers the second metal sub-layer ML2, and the material of the third metal sub-layer ML3 includes a molybdenum titanium alloy.

In detail, the step of depositing the metal layer ML in step S200 includes sequentially depositing the first metal sub-layer ML1, the second metal sub-layer ML2, and the third metal sub-layer ML3, as shown in FIG. 5b.

Figure 6:
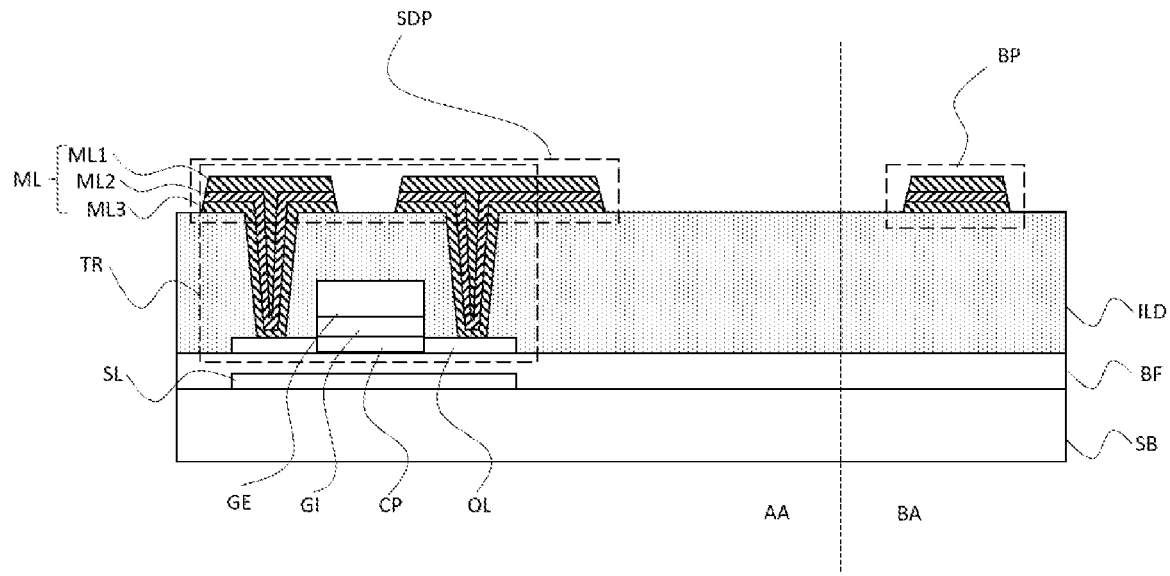
FIG. 6 is a schematic view of a structure of a display panel in still another step of production of an embodiment of the present disclosure.

In detail, please refer to FIG. 6, FIG. 6 is a schematic view of a structure of a display panel in still another step of production of an embodiment of the present disclosure. In the method of manufacturing the display panel of some embodiments of the present application, step 300: patterning the metal layer ML to form the source/drain patterns SDP and the pad patterns BP.

In detail, after the third metal sub-layer ML3 is etched, an untidy area may be generated at the end or edge of the third metal sub-layer ML3. The generation of untidy areas is related to the thickness and material of the third metal sub-layer ML3.

In detail, the material of the third metal sub-layer ML3 includes a molybdenum titanium alloy. The thickness of the first metal sub-layer ML1 is greater than zero and less than 100 nm, the thickness of the second metal sub-layer ML2 ranges from 400 nm to 800 nm, and the thickness of the third metal sub-layer ML3 is greater than zero and less than 100 nm.

In detail, the material of the second metal sub-layer ML2 is copper, and the use of a thicker second metal sub-layer ML2 can ensure low trace impedance and avoid affecting the brightness uniformity of a large display panel.

In detail, copper has better conductivity. If a molybdenum-titanium alloy is used as a trace in a large display panel, it will cause extremely high trace impedance. Therefore, it is still necessary to use a metal with better conductivity, such as copper, as the material for the wiring. However, if copper is exposed to the air, it is easily oxidized, resulting in poor electrical properties. If a mask is used to etch the metal layer ML to form the source/drain patterns SDP and the bonding pad patterns BP, the bonding pad patterns BP will then be exposed to air and be oxidized while waiting to be bonded or soldered with the flexible circuit board. Therefore, this embodiment adopts multiple metal sub-layers, wherein the second metal sub-layer ML2 covers the first metal sub-layer ML1. The third metal sub-layer ML3 covers the second metal sub-layer ML2. The material of the second metal sub-layer ML2 includes copper and the material of the third metal sub-layer ML3 includes a molybdenum-titanium alloy. Using a molybdenum-titanium alloy that is less prone to oxidation as the third metal sub-layer ML covers the second metal sub-layer ML2 made of copper, which can avoid from the problem of bonding pad oxidation.

Figure 7:
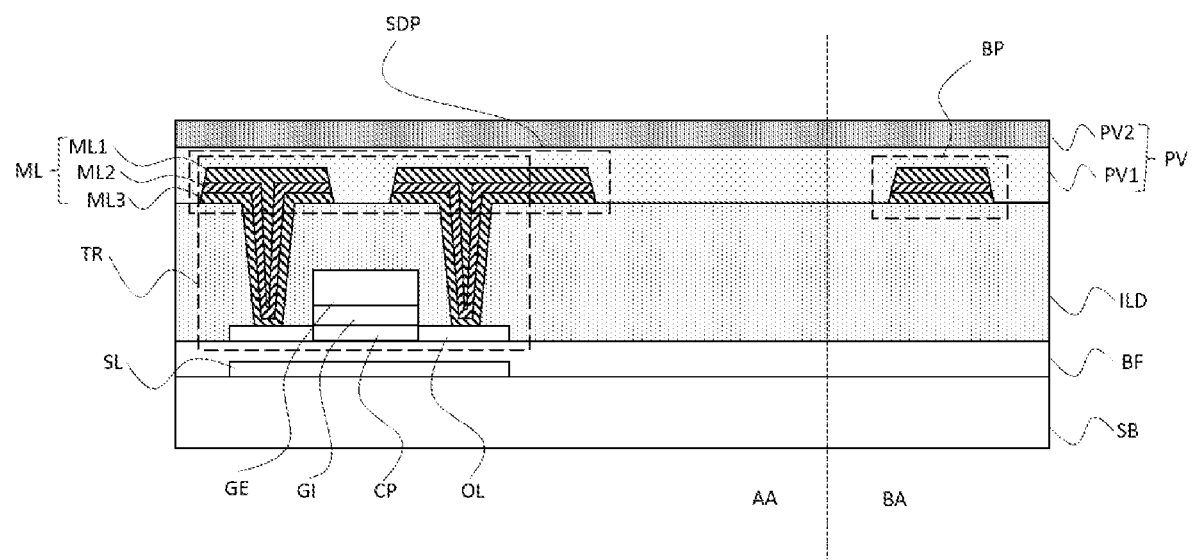
FIG. 7 is a schematic view of a structure of a display panel in further another step of production of an embodiment of the present disclosure.

In detail, please refer to FIG. 7, FIG. 7 is a schematic view of a structure of a display panel in further another step of production of an embodiment of the present disclosure. In one embodiment of the method of manufacturing the display panel includes the step S400: depositing a first passivation sub-layer PV1 on the source/drain patterns SDP and the bonding pad patterns BP, and the step S500: depositing a second passivation sub-layer PV2 on the first passivation sub-layer PV1. Material of the first passivation sub-layer includes silicon nitride.

In detail, because material of the third metal sub-layer ML3 includes molybdenum-titanium alloy, it is easy to produce untidy area at the ends or edges of the third metal sub-layer ML3 during the process of forming the source/drain patterns SDP and the bonding pad patterns BP by etching. Material of the first sub-passivation layer PV1 includes silicon nitride with a better step coverage. Even if the end of the metal layer ML under the first passivation sub-layer PV1 has untidy area, it can still be covered well to avoid from gaps or cracks between the passivation layer and the metal layer ML. At the same time, because the present embodiment adopts the plurality of stacked metal sub-layers, a same mask can be used to form both the source/drain patterns SDP and the bonding pad patterns BP to simplify the manufacturing process of the display panel.

Figure 8:
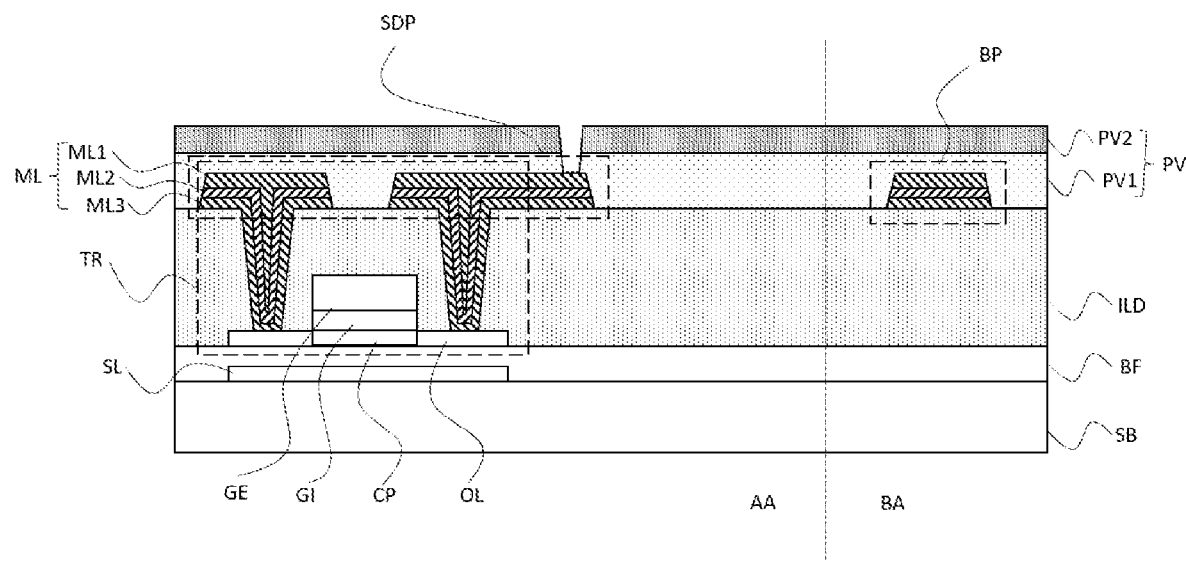
FIG. 8 is a schematic view of a structure of a display panel in still another step of production of an embodiment of the present disclosure.

Please refer to FIG. 8, FIG. 8 is a schematic view of a structure of a display panel in still another step of production of an embodiment of the present disclosure. The method of manufacturing the display panel of some embodiments of the present application further includes etching the second passivation sub-layer PV2 and the first passivation sub-layer PV1 to form an opening connected to the drain DE.

Figure 9:
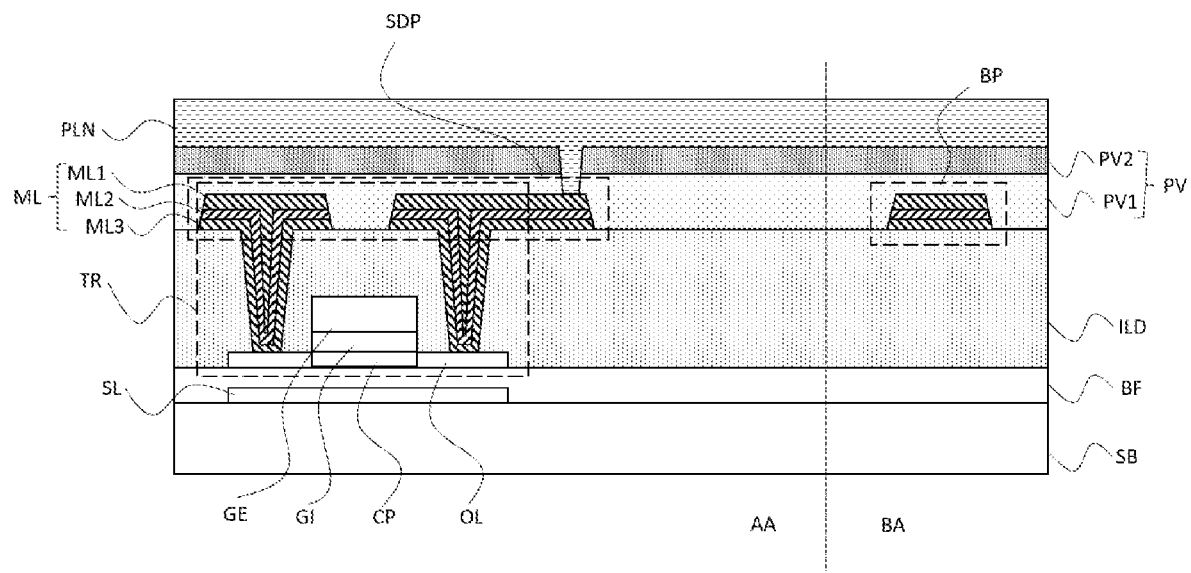
FIG. 9 is a schematic view of a structure of a display panel in still another step of production of an embodiment of the present disclosure.

Please refer to FIG. 9, FIG. 9 is a schematic view of a structure of a display panel in still another step of production of an embodiment of the present disclosure. The method of manufacturing the display panel of some embodiments of the present application further includes depositing a planarization layer PLN on the second passivation sub-layer PV2.

Figure 10:
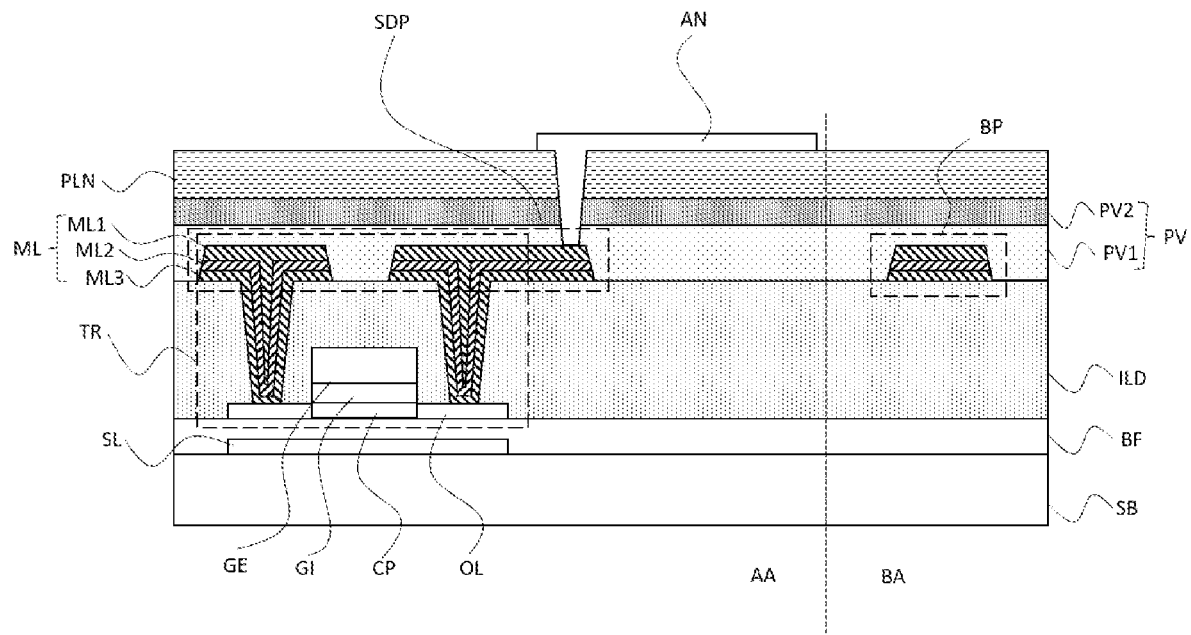
FIG. 10 is a schematic view of a structure of a display panel in still another step of production of an embodiment of the present disclosure.

Please refer to FIG. 10, FIG. 10 is a schematic view of a structure of a display panel in still another step of production of an embodiment of the present disclosure. The method of manufacturing the display panel of some embodiments of the present application further includes etching the planarization layer PLN to form an opening connected to the drain DE, depositing and patterning an electrical conductive layer to form an anode AN connected to the drain DE. In detail, the electrical conductive layer material includes indium tin oxide (ITO).

Figure 11:
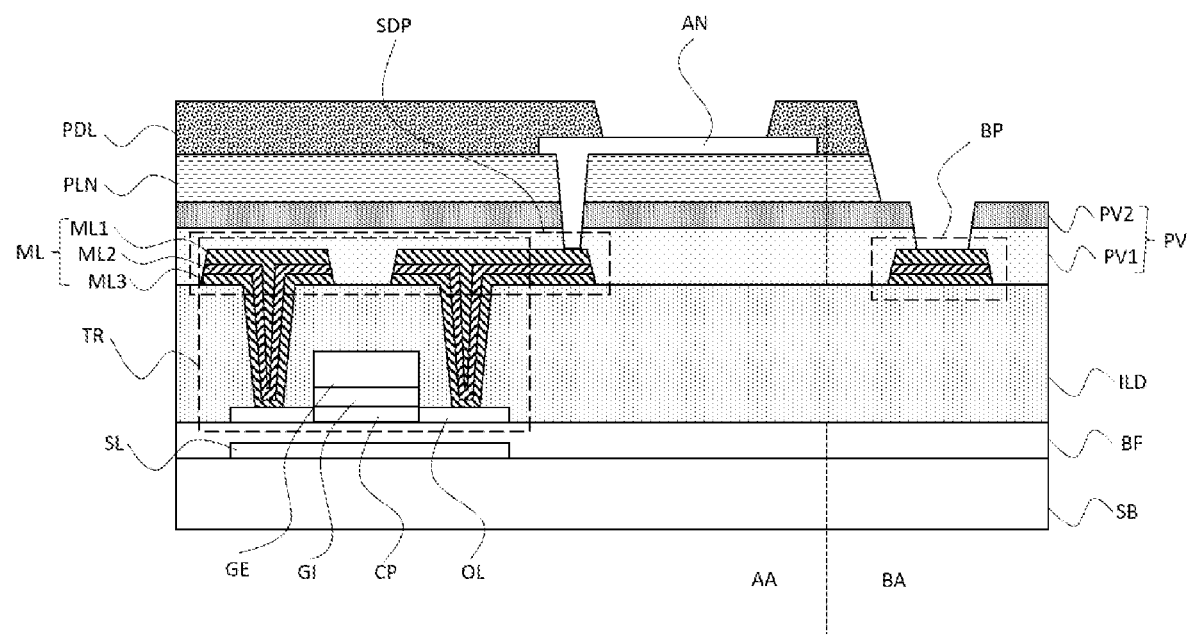
FIG. 11 is a schematic view of a structure of a display panel in still another step of production of an embodiment of the present disclosure.

Please refer to FIG. 11, FIG. 11 is a schematic view of a structure of a display panel in still another step of production of an embodiment of the present disclosure. The method of manufacturing the display panel of some embodiments of the present application further includes providing a pixel definition layer PDL and etching the planarization layer PLN, the second passivation sub-layer PV2, and the first passivation sub-layer PV1 to expose the bonding pad patterns BP, wherein the pixel definition layer PDL exposes a part of the anode AN. The bonding pad patterns BP is exposed for subsequent connection with the flexible circuit board. Because the bonding pad patterns BP include the stacked first metal sub-layer ML1, the second metal sub-layer ML2, and the third metal sub-layer ML3, the outermost third metal sub-layer ML3 made of a molybdenum-titanium alloy can protect the second metal sub-layer ML2 with copper as a material from being oxidized.

In comparison with prior art, the disclosure provides the display panel 100, the display device DD, and the method of manufacturing the display panel include the plurality of stacked metal sub-layers and the first passivation sub-layer and the second passivation sub-layer stacked. The first passivation sub-layer is disposed between the metal layer and the second passivation layer. Material of the first passivation sub-layer includes silicon nitride. The first passivation sub-layer covers the untidy (tip) area at the ends of the molybdenum-titanium alloy thin layer to avoid from detachment of the passivation layer, and meanwhile to solve the issues of simplifying the manufacturing process of the display panel, and to avoid from oxidation of the bonding pads.

The display panel, the display device, and the method of manufacturing the display panel provided by the embodiments of the present application are described in detail above.

For the specific implementation of the above operations, please refer to the previous embodiments, which will not be repeated here.

The present disclosure of a display panel, a display device, and a method of manufacturing a display panel have been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A display panel, comprising a display region and a bezel region, wherein the display panel further comprises:
    a substrate;
    a metal layer disposed on the substrate and comprising a plurality of stacked metal sub-layers; and
    a passivation layer disposed on the metal layer and comprising stacked first passivation sub-layer and second passivation sub-layer, wherein the first passivation sub-layer is disposed between the metal layer and the second passivation sub-layer, the metal layer further comprises source/drain patterns in the display region and bonding pad patterns in the bezel region, and material of the first passivation sub-layer comprises silicon nitride.

2. The display panel according to claim 1, wherein the first passivation sub-layer covers the metal layer, the second passivation sub-layer covers the first passivation sub-layer, and material of the second passivation sub-layer comprises silicon oxide.

3. The display panel according to claim 2, wherein a thickness of the first passivation sub-layer ranges from 100 nm to 300 nm, and a thickness of the second passivation sub-layer ranges from 100 nm to 300 nm.

4. The display panel according to claim 2, wherein the plurality of metal sub-layers comprises a first metal sub-layer, a second metal sub-layer, and a third metal sub-layer, and wherein the second metal sub-layer covers the first metal sub-layer, the third metal sub-layer covers the second metal sub-layer, and material of the third metal sub-layer comprises molybdenum titanium alloy.

5. The display panel according to claim 4, wherein material of the first metal sub-layer comprises molybdenum titanium alloy, and material of the second metal sub-layer comprises copper.

6. The display panel according to claim 5, wherein a thickness of the first metal sub-layer is greater than zero and less than 100 nm, a thickness of the second metal sub-layer ranges from 400 nm to 800 nm, and a thickness of the third metal sub-layer is greater than zero and less than 100nm.

7. The display panel according to claim 1, wherein the display panel further comprises:
    a planarization layer disposed on the passivation layer; and a light emitting component disposed on the planarization layer.

8. A display device, comprising a display panel and driving component connected to the display panel through a flexible circuit board, wherein the display panel comprises a display region and a bezel region and further comprises:
a substrate;
a metal layer disposed on the substrate and comprising a plurality of stacked metal sub-layers; and
a passivation layer disposed on the metal layer and comprising stacked first passivation sub-layer and second passivation sub-layer, wherein the first passivation sub-layer is disposed between the metal layer and the second passivation sub-layer, the metal layer further comprises source/drain patterns in the display region and bonding pad patterns in the bezel region, material of the first passivation sub-layer comprises silicon nitride, and the flexible circuit board is connected to the bonding pad patterns of the display panel.

9. The display device according to claim 8, wherein the first passivation sub-layer covers the metal layer, the second passivation sub-layer covers the first passivation sub-layer, and material of the second passivation sub-layer comprises silicon oxide.

10. The display device according to claim 9, wherein a thickness of the first passivation sub-layer ranges from 100 nm to 300 nm, and a thickness of the second passivation sub-layer ranges from 100 nm to 300 nm.

11. The display device according to claim 9, wherein the plurality of metal sub-layers comprises a first metal sub-layer, a second metal sub-layer, and a third metal sub-layer, and wherein the second metal sub-layer covers the first metal sub-layer, the third metal sub-layer covers the second metal sub-layer, and material of the third metal sub-layer comprises molybdenum titanium alloy.

12. The display device according to claim 11, wherein material of the first metal sub-layer comprises molybdenum titanium alloy, and material of the second metal sub-layer comprises copper.

13. The display device according to claim 12, wherein a thickness of the first metal sub-layer is greater than zero and less than 100 nm, a thickness of the second metal sub-layer ranges from 400 nm to 800 nm, and a thickness of the third metal sub-layer is greater than zero and less than 100 nm.

14. The display device according to claim 8, wherein the display panel further comprises:
a planarization layer disposed on the passivation layer; and
a light emitting component disposed on the planarization layer.

15. A method of manufacturing a display panel, comprising steps of:
providing a substrate, wherein the substrate comprises a first part corresponding to a display region of the display panel and a second part corresponding to a bezel region of the display panel;
depositing a metal layer on the substrate, wherein the metal comprises a plurality of stacked metal sub-layers;
patterning the metal layer to form source/drain patterns in a part of the metal layer corresponding to the first part of the substrate and to form bonding pad patterns in a part of the metal layer corresponding to the second part of the substrate;
depositing a first passivation sub-layer on the source/drain patterns and the bonding pad patterns; and
depositing a second passivation sub-layer on the first passivation sub-layer, wherein material of the first passivation sub-layer comprises silicon nitride.

16. The method of manufacturing the display panel according to claim 15, wherein the plurality of metal sub-layers comprises a first metal sub-layer, a second metal sub-layer, and a third metal sub-layer, and wherein the second metal sub-layer covers the first metal sub-layer, the third metal sub-layer covers the second metal sub-layer, and material of the third metal sub-layer comprises molybdenum titanium alloy.

* * * * *